(12) United States Patent
Pan et al.

(10) Patent No.: US 12,407,981 B2
(45) Date of Patent: Sep. 2, 2025

(54) AUDIO SYSTEM

(71) Applicant: HARMAN INTERNATIONAL INDUSTRIES, INCORPORATED, Stamford, CT (US)

(72) Inventors: Zhongfeng Pan, Shanghai (CN); Lei Wang, Jiangsu (CN); Qiang Zhou, Shanghai (CN); Weijia Lu, Shanghai (CN)

(73) Assignee: Harman International Industries, Incorporated, Stamford, CT (US)

( * ) Notice: Subject to any disclaimer, the term of this patent is extended or adjusted under 35 U.S.C. 154(b) by 213 days.

(21) Appl. No.: 18/230,942

(22) Filed: Aug. 7, 2023

(65) Prior Publication Data

US 2024/0056731 A1    Feb. 15, 2024

(30) Foreign Application Priority Data

Aug. 10, 2022   (CN) .......................... 202210954409.1

(51) Int. Cl.
| | | |
|---|---|---|
| *H04R 3/00* | (2006.01) | |
| *H03F 3/21* | (2006.01) | |
| *H04R 29/00* | (2006.01) | |

(52) U.S. Cl.
CPC .............. *H04R 3/00* (2013.01); *H03F 3/211* (2013.01); *H04R 29/001* (2013.01); *H03F 2200/03* (2013.01)

(58) Field of Classification Search
CPC ........ H04R 3/00; H04R 5/04; H04R 2499/13; H04R 29/001; H03F 3/211; H03F 2200/03
USPC ........................................... 381/59, 97, 120
See application file for complete search history.

(56) References Cited

U.S. PATENT DOCUMENTS

| | | | | |
|---|---|---|---|---|
| 5,617,478 | A * | 4/1997 | Tagami | H04R 5/04 704/214 |
| 7,382,888 | B2 * | 6/2008 | Aylward | H04S 5/00 381/303 |
| 7,463,743 | B2 * | 12/2008 | Lechner | H04R 3/12 379/420.02 |
| 7,477,752 | B2 * | 1/2009 | Kirk | H04R 5/04 381/97 |

(Continued)

OTHER PUBLICATIONS

Extended European Search Report dated Jan. 15, 2024 for European Patent Application No. 23183333.6, 9 pages.

*Primary Examiner* — Disler Paul
(74) *Attorney, Agent, or Firm* — Brooks Kushman, P.C.

(57) ABSTRACT

The present disclosure provides an audio system. The audio system includes: a target audio signal generator module including a plurality of target audio signal generators, configured to receive an audio signal and a tracking signal and generate a plurality of target audio signals based on the audio signal and tracking signal; a tracking power supply circuit module including a plurality of tracking power supply circuits, configured to receive the plurality of target audio signals and generate a plurality of power supply voltages based on the plurality of target audio signals; an audio power amplifying circuit module including a plurality of audio amplifying circuits, configured to receive the plurality of target audio signals and the plurality of power supply voltages, and amplify the plurality of target audio signals; wherein each of the plurality of tracking power supply circuits provides a corresponding power supply voltage for each of the plurality of audio amplifying circuits.

20 Claims, 8 Drawing Sheets

(56) References Cited

U.S. PATENT DOCUMENTS

| | | | |
|---|---|---|---|
| 8,416,017 B2* | 4/2013 | Kohut | H03F 3/2173 330/10 |
| 2009/0016549 A1 | 1/2009 | French et al. | |

* cited by examiner

AUDIO SYSTEM

CROSS-REFERENCE TO RELATED APPLICATIONS

This application claims priority to CN application Serial No. 202210954409.1 filed Aug. 10, 2022, the disclosure of which is hereby incorporated in its entirety by reference herein.

TECHNICAL FIELD

The present disclosure generally relates to audio systems, and in particular, to an audio system having an efficient audio power amplifier.

BACKGROUND

With the widespread application of audio power amplifiers in vehicle-mounted audio systems, higher requirements have been put forward for the efficiency of audio power amplifiers. Therefore, there is some room for improvement in improving the efficiency of audio power amplifiers. In addition, it is expected to reduce the power consumption of the power amplifiers while still ensuring good listening experience for users.

Therefore, an improved technical solution is needed to address the above problems.

SUMMARY

According to one aspect of the present disclosure, a system is provided. The system may include a target audio signal generator module, a tracking power supply circuit module, and an audio power amplifier module. The target audio signal generator module may include a plurality of target audio signal generators. The target audio signal generator module receives an audio signal and a tracking signal and generates a plurality of target audio signals based on the audio signal and the tracking signal. The tracking power supply circuit module includes a plurality of tracking power supply circuits. The tracking power supply circuit module receives the plurality of target audio signals and generates a plurality of power supply voltages based on the plurality of target audio signals. The audio power amplifier module includes a plurality of audio power amplifying circuits. The audio power amplifier module receives the plurality of target audio signals and the plurality of power supply voltages and amplifies the plurality of target audio signals. Each of the plurality of tracking power supply circuits provides a corresponding power supply voltage for each of the plurality of audio power amplifying circuits.

According to one or a plurality of embodiments, the plurality of target audio signal generators includes a first target audio generator and a second target audio generator. The first target audio generator receives an in-phase audio signal of the audio signal and the tracking signal and generates a first target audio signal based on the in-phase audio signal and the tracking signal. The second target audio generator receives an anti-phase audio signal of the audio signal and a tracking signal and generates a second target audio signal based on the anti-phase audio signal and the tracking signal.

According to one or a plurality of embodiments, the plurality of tracking power supply circuits includes a first tracking power supply circuit and a second tracking power supply circuit; and the plurality of audio power amplifying circuits include a first power amplifying circuit and a second power amplifying circuit.

According to one or a plurality of embodiments, the first tracking power supply circuit receives the first target audio signal and generates a first power supply voltage for the first power amplifying circuit based on the first target audio signal; and the second tracking power supply circuit receives the second target audio signal and generates a second power supply voltage for the second power amplifying circuit based on the second target audio signal.

According to one or a plurality of embodiments, the first power amplifying circuit amplifies the received first target audio signal based on the first power supply voltage to generate a first amplified audio signal; and the second power amplifying circuit amplifies the received second target audio signal based on the second power supply voltage to generate a second amplified audio signal.

According to one or a plurality of embodiments, the first target audio generator includes a first audio signal biasing circuit and a first target audio signal processing circuit; and the second target audio generator includes a second audio signal biasing circuit and a second target audio signal processing circuit.

According to one or a plurality of embodiments, the first audio signal biasing circuit is configured to DC bias the in-phase audio signal using a reference voltage to generate a first biased audio signal; and the second audio signal biasing circuit is configured to DC bias the anti-phase audio signal using the reference voltage to generate a second biased audio signal.

According to one or a plurality of embodiments, the first target audio signal processing circuit receives the first biased audio signal, and superimposes the first biased audio signal and half of the tracking signal to output the first target audio signal; and the second target audio signal processing circuit receives the second biased audio signal, and superimposes the second biased audio signal and half of the tracking signal to output the second target audio signal.

According to one or a plurality of embodiments, the first power amplifying circuit and the second power amplifying circuit are bridge connected, so that the first power amplifying circuit and the second power amplifying circuit output amplified signals with opposite phases.

According to one or a plurality of embodiments, the audio system further includes a speaker, and the speaker generates an output signal for reproducing an audio based on the first amplified audio signal and the second amplified audio signal.

BRIEF DESCRIPTION OF THE DRAWINGS

The present disclosure may be better understood by reading the following description of non-limiting embodiments with reference to the accompanying drawings, in which.

DETAILED DESCRIPTION

It should be understood that the following description of embodiments is provided for illustrative purposes only and not for limiting purposes. The division of examples in functional blocks, modules, or units shown in the drawings should not be interpreted as indicating that these functional blocks, modules, or units must be realized as physically separate units. Functional blocks, modules, or units shown or described may be implemented as separate units, circuits, chips, functional blocks, modules, or circuit elements. One or a plurality of functional blocks or units may also be implemented in a common circuit, chip, circuit element, or unit.

The use of a singular term (such as, but not limited to, "a") is not intended to limit the quantity of the item. Use of relational terms such as, but not limited to, "top," "bottom," "left," "right," "upper," "lower," "downward," "upward," "lateral," "first," "second," ("third," and the like), "inlet," "outlet," and the like are used in written descriptions for clarity when specific reference is made to the drawings and are not intended to limit the scope of the present disclosure or the appended claims, unless otherwise specified. The terms "including" and "such as" are illustrative rather than restrictive, and the word "can" entails "can, but not necessarily," unless otherwise stated. Notwithstanding the use of any other language in the present disclosure, the embodiments shown in the accompanying drawings are examples given for purposes of illustration and explanation, and not the only embodiment of the subject matter herein.

Generally, when the output power of an audio power amplifier is constant, if an excessively high-power supply voltage is used to power the audio power amplifier, the power consumption of the power amplifier will be too high. If an excessively low power supply voltage is used to power the audio power amplifier, it will also have an adverse impact that an output signal is clipped. Therefore, the power supply voltage of the audio power amplifier may use a lower voltage that meets a requirement that the output signal is undistorted. The use of a Tracking Power Supply (TPS) circuit to power the audio power amplifier may effectively meet the above expectations.

Figure 1:
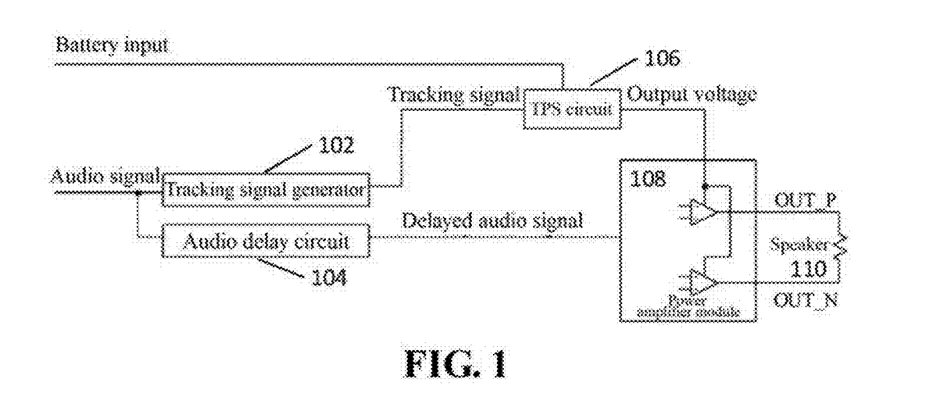
FIG. 1 schematically shows a principle diagram of an audio system according to one or a plurality of embodiments of one aspect of the present disclosure.

FIG. 1 shows a schematic diagram of an audio system according to one or a plurality of embodiments of one aspect of the present disclosure, wherein one diagram of using a TPS circuit to power an audio power amplifier is shown. As shown in FIG. 1, the system includes a tracking signal generator 102, an audio delay circuit 104, a TPS circuit 106, a power amplifier module 108, and a speaker 110. Audio signals are input to the tracking signal generator 102 and the audio delay circuit 104, respectively.

The tracking signal generator 102 may generate a tracking signal based on the input audio signal. In some examples, the tracking signal generator 102 may generate a tracking signal based on the volume of the input audio signal (e.g., that is, a voltage amplitude of the input audio signal). For example, the amplitude of the tracking signal may vary with the volume or voltage amplitude of the input audio signal.

The TPS circuit 106 is located between a battery input and the power amplifier module 108 and used for supplying power to the power amplifier module 108. The TPS circuit 106 outputs, based on the tracking signal generated by the tracking signal generator 102 and the voltage input from the battery, an output voltage for supplying power to the power amplifier module 108. For example, the TPS circuit 106 may be a boost TPS circuit that can adjust an output voltage based on the tracking signal (such as boosting the voltage output from the battery) to supply power to the power amplifier module 108. For example, the output voltage of the TPS circuit 106 may vary with the volume or amplitude of the audio signal. For example, the output voltage of the TPS circuit may be directly proportional to the volume or amplitude of the audio signal. In other words, the tracking signal is generated from an envelope of the to-be-amplified audio signal input through a channel. When the amplitude of the audio signal envelope increases, the signal amplitude of the tracking signal also increases, and the TPS circuit 106 needs to output a higher voltage to the subsequent audio amplifier module. On the contrary, when the amplitude of the audio signal envelope decreases, the signal amplitude of the tracking signal also decreases, and the TPS circuit 106 needs to output a lower voltage to the subsequent audio amplifier module.

During a boost process of the TPS circuit 106, if the audio signal is directly input to the power amplifier module 108, the signal amplified by the power amplifier 108 will experience a clipping phenomenon. In order to avoid the occurrence of clipping in the amplified audio signal, the audio signal is delayed by the audio delay circuit 104 before entering the power amplifier module 108, so as to generate a delayed audio signal. Thus, for example, by corresponding the time of audio delay to the time when the TPS circuit 106 completes boosting, the phenomenon of clipping in the amplified audio signal may be avoided.

The delayed audio signal is amplified by the power amplifier module 108 and provided to the speaker. In some examples, the power amplifier module 108 may be composed of two power amplifiers that are out-of-phase bridge connected. The two power amplifiers that are out-of-phase bridge connected may output an in-phase audio signal OUT_P and an anti-phase audio signal OUT_N based on the delayed audio signal. The in-phase audio signal refers to an output signal that has the same phase as the input audio signal. The anti-phase audio signal refers to an output signal that is opposite in phase to the input audio signal. The in-phase audio signal OUT_P and the anti-phase audio signal OUT_N are provided to the speaker to generate an output signal for reproducing an audio.

Figure 2:
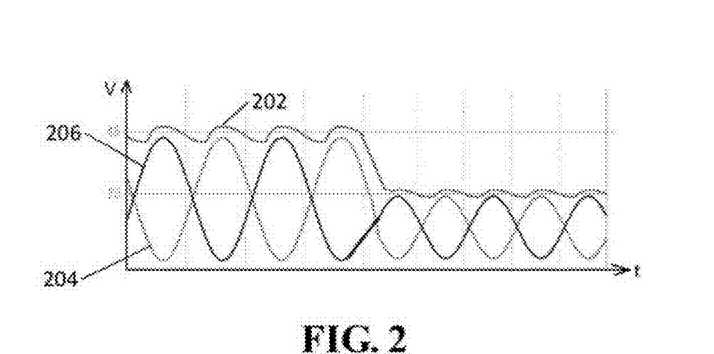
FIG. 2 shows an oscillogram of an output voltage signal of a tracking power supply (TPS) circuit, an in-phase audio signal OUT_P, and an anti-phase audio signal OUT_N output by a power amplifier module 108 in FIG. 1.

For intuitive understanding, FIG. 2 shows an oscillogram of an output voltage (also referred to as a power supply voltage) signal 202 of a TPS circuit 106, and an in-phase audio signal OUT_P 204 and an anti-phase audio signal OUT_N 206 output by a power amplifier module 108 in FIG. 1. As can be seen from FIG. 2, when the audio signal output by the power amplifier has a high amplitude, the power supply voltage output by the TPS circuit 106 for supplying power to the power amplifier is also high, so that the signal output by the power amplifier will not be clipped. When the audio signal output by the power amplifier has a lower amplitude, the voltage output by the TPS circuit 106 for supplying power to the power amplifier also decreases. This may reduce loss of the power amplifier and improve the efficiency of the power amplifier.

Based on the above, the audio system in FIG. 1 may adaptively supply power to the power amplifier according to the amplitude of the audio signal by utilizing the control of the TPS circuit 106. Specifically, if the volume or amplitude of the audio signal is large, the power supply voltage for supplying power to the power amplifier is high, and vice versa. Through this power supply configuration, the power consumption of the power amplifier may be reduced to a certain extent, thereby reducing the heat it dissipates, and improving the efficiency of the power amplifier to a certain extent.

However, there may be room for improvement based on the audio system in FIG. 1. In the above description for FIG. 1, an example of the power amplifier module 108 including two bridge connected power amplifiers is given. In this configuration structure, when one power amplifier outputs a valley voltage, the other power amplifier outputs a peak voltage. In order to prevent the peak voltage output by the other power amplifier from clipping, a higher power supply voltage for power supply may be utilized. This design may result in a still excessively high output voltage (also referred to as the power supply voltage below) supplying power to the power amplifier module even when one power amplifier outputs a valley voltage (and the other power amplifier outputs a peak voltage), thereby resulting in significant heat dissipation. An example is illustrated below with reference to FIG. 3.

Figure 3:
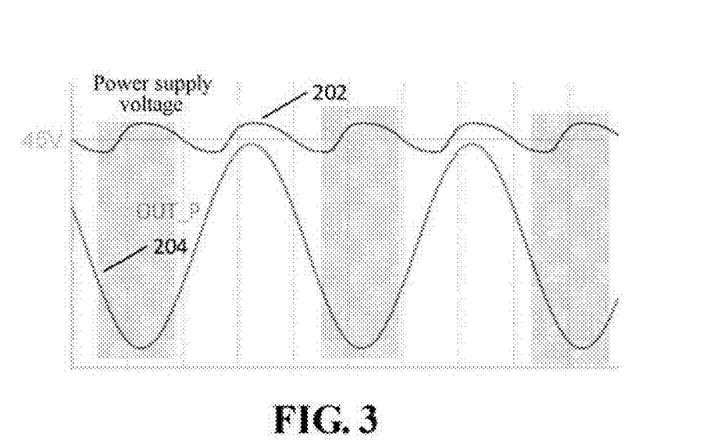
FIG. 3 schematically shows instantaneous outputs of the output voltage signal of the TPS circuit and the anti-phase audio signal OUT_P output by one of the power amplifiers in FIG. 2.

For clarity, FIG. 3 shows instantaneous outputs of the output voltage signal 202 of the TPS circuit and the in-phase audio signal OUT_P 204 output by one of the power amplifiers in FIG. 2. It should be understood that this is for the purpose of concise explanation of the principle, rather than limiting the specific audio signals of specific power amplifiers. For example, as can be observed from the figure, when the in-phase audio signal OUT_P is at a valley value, for the power amplifier outputting the audio signal OUT_P (that is, a half bridge circuit of the power amplifier module), the power supply voltage provided by the TPS circuit is too high. For example, as can be observed from a gray area in FIG. 3, a valley voltage of the OUT_P signal is close to 0 V, and the power supply voltage is around 45 V (to ensure that the OUT_N signal is not clipped). This entails that during this period, the TPS circuit 106 increases the voltage from the battery voltage to 45 V, and then the power amplifier drops the voltage from 45 V to nearly 0 V. However, in this working mode, both the TPS circuit 106 and the amplifier circuit will introduce significant power losses. For example, when the output of the power amplifier is at the valley value, although the valley voltage is close to 0 V, for a speaker such as 4 OHM, a current of the speaker is about 10 A. Therefore, for a required power supply voltage of 45 V, the power supply power will reach 450 VA. In other words, when the power amplifier output OUT_P is at the valley value, both the amplifier circuit and the TPS circuit 106 will generate significant power loss. Therefore, there is room for further improvement.

In order to further improve the efficiency of the power amplifier and to reduce the power loss of the power amplifier, or to enable the power amplifier to output greater power under the same power loss limit, thereby bringing a better auditory experience to a listener, the present disclosure provides an audio system in another aspect. In the configuration of the audio system, TPS circuits may be configured for an in-phase audio amplifying circuit and an anti-phase audio amplifying circuit in a power amplifier module, and the TPS circuits configured for the in-phase audio amplifying circuit and the anti-phase audio amplifying circuit may be controlled by using an in-phase audio signal and an anti-phase audio signal that includes common-mode tracking signals.

Figure 4:
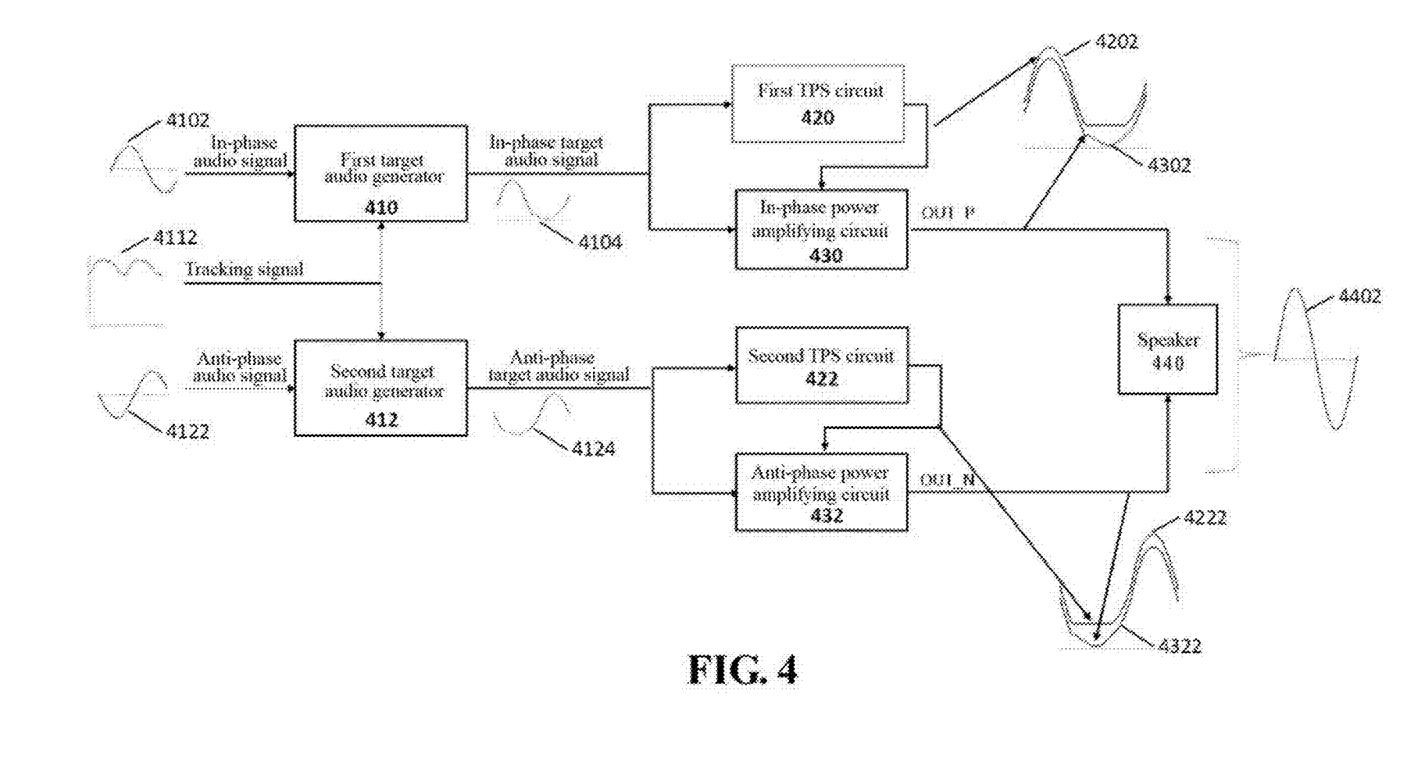
FIG. 4 schematically shows a principle diagram of an audio system according to one or a plurality of embodiments of another aspect of the present disclosure.

FIG. 4 shows a configuration diagram of an audio system according to one or a plurality of embodiments of another aspect of the present disclosure. The working principle of the audio system shown in FIG. 4 is described as follows. In summary, a target audio signal generator module receives an audio signal and a tracking signal and generates a target audio signal. The target audio signal is fed to a power amplifier to be amplified. At the same time, the target audio signal is also fed to a TPS circuit to generate an output voltage slightly higher than an output signal of the power amplifier. A power amplifier module may include an in-phase power amplifying circuit and an anti-phase power amplifying circuit. The in-phase power amplifying circuit and the anti-phase power amplifying circuit are supplied with power supply voltages by their respective TPS circuits. Specific description is made below with reference to FIG. 4.

As shown in FIG. 4, the above target audio signal generator module may include a first target audio generator 410 and a second target audio generator 412. The first target audio generator 410 receives an in-phase audio signal; and the second target audio generator 412 receives an anti-phase audio signal. The in-phase audio signal refers to a signal with the same amplitude and phase as the audio signal. The anti-phase audio signal refers to a signal with the same amplitude but opposite phase as the audio signal. In other words, a difference between the in-phase audio signal and the anti-phase audio signal is only the opposite phases. For the sake of intuitive understanding, schematic waveforms 4102 and 4122 of the in-phase audio signal and the anti-phase audio signal are shown as examples in FIG. 4.

In addition, the tracking signal (whose waveform may be seen in an exemplary schematic waveform 4112) is input to the first target audio generator 410 and the second target audio generator 412, respectively. In some examples, the tracking signal may be generated by a tracking signal generator based on the volume or amplitude of the audio signal. As described above with reference to FIG. 1, the tracking signal is generated from an envelope of the to-be-amplified audio signal input through the channel. When the amplitude of the audio signal envelope increases, the signal amplitude of the tracking signal also increases. On the contrary, when the amplitude of the audio signal envelope decreases, the signal amplitude of the tracking signal also decreases.

The first target audio generator 410 receives the in-phase audio signal and the tracking signal and generates an in-phase target audio signal based on the in-phase audio signal and the tracking signal (see a schematic waveform 4104). In some examples, the first target audio generator 410 superimposes the in-phase audio signal and the tracking signal to generate the in-phase target audio signal. As can be seen from the waveform 4104, the generated in-phase target audio signal exhibits distortion due to the mixing and superimposing of the tracking signal in the in-phase audio signal. Similarly, the second target audio generator 412 receives the anti-phase audio signal and the tracking signal and generates an anti-phase target audio signal based on the anti-phase audio signal and the tracking signal (see a schematic waveform 4124). In some examples, the second target audio generator 412 superimposes the anti-phase audio signal and the tracking signal to generate the anti-phase target audio signal. As can be seen from the waveform 4124, the generated anti-phase target audio signal has a certain degree of distortion due to the mixing and superimposing of the tracking signal in the anti-phase audio signal.

In the above process, by simultaneously inputting the tracking signal into the first target audio generator 410 and the second target audio generator 412, the generated in-phase target audio signal and anti-phase target audio signal have a common-mode signal part. Although there is distortion in the in-phase target signal and the anti-phase target signal generated therefrom, the distortion will be eliminated in subsequent processing of the system. This section will be described later.

In the schematic diagram of the audio system in FIG. 4, the audio power amplifier module may be composed of two power amplifying circuits. Each of the two power amplifying circuits is configured with a separate TPS circuit to supply power for it. Specifically, the above audio power amplifier module may be composed of an in-phase power amplifying circuit 430 and an anti-phase power amplifying circuit 432. The in-phase power amplifying circuit 430 is configured with a first TPS circuit 420 that supplies power to the first TPS circuit 420; and the anti-phase power amplifying circuit 432 is equipped with a second TPS circuit 422 that supplies power to the second TPS circuit 422. The in-phase target audio signal output by the first target audio generator 410 is input to the first TS circuit 420 and the in-phase power amplifying circuit 430. The in-phase target audio signal output by the second target audio generator 412 is input to the second TPS circuit 422 and the anti-phase power amplifying circuit 432.

The first TPS circuit 420 receives the in-phase target audio signal and generates a first power supply voltage for the in-phase power amplifying circuit 430 based on the in-phase target audio signal. For example, the first TPS circuit 420 generates the first power supply voltage for the in-phase power amplifying circuit 430 based on an envelope amplitude of the in-phase target audio signal. The in-phase power amplifying circuit 430 receives the in-phase target audio signal and amplifies the in-phase target audio signal based on the first power supply voltage output by the first TPS circuit 420. In one example, a schematic waveform of the first power supply voltage output by the first TPS circuit 420 is intuitively represented by a waveform curve 4202. A signal waveform of the amplified in-phase audio signal OUT_P output by the in-phase power amplifying circuit 430 is intuitively represented by a waveform curve 4302.

Similarly, the second TPS circuit 422 receives the anti-phase target audio signal and generates a second power supply voltage for the anti-phase power amplifying circuit 432 based on the anti-phase target audio signal. For example, the second TPS circuit 422 generates the second power supply voltage for the anti-phase power amplifying circuit 432 based on an envelope amplitude of the anti-phase target audio signal. The anti-phase power amplifying circuit 432 receives the anti-phase target audio signal and amplifies the anti-phase target audio signal based on the second power supply voltage output by the second TPS circuit 422. In one example, a schematic waveform of the second power supply voltage output by the second TPS circuit 422 is intuitively represented by a waveform curve 4222. A signal waveform of the amplified anti-phase audio signal OUT_N output by the anti-phase power amplifying circuit 432 is intuitively represented by a waveform curve 4322.

The amplified in-phase audio signal OUT_P output by the in-phase power amplifying circuit 430 and the amplified anti-phase audio signal OUT_N output by the anti-phase power amplifying circuit 432 are input to two input ends of a speaker 440. A schematic signal waveform diagram of a differential audio signal (OUT_P-OUT_N) observed at both ends of the speaker 440 is shown by a waveform curve 4402.

Figure 5:
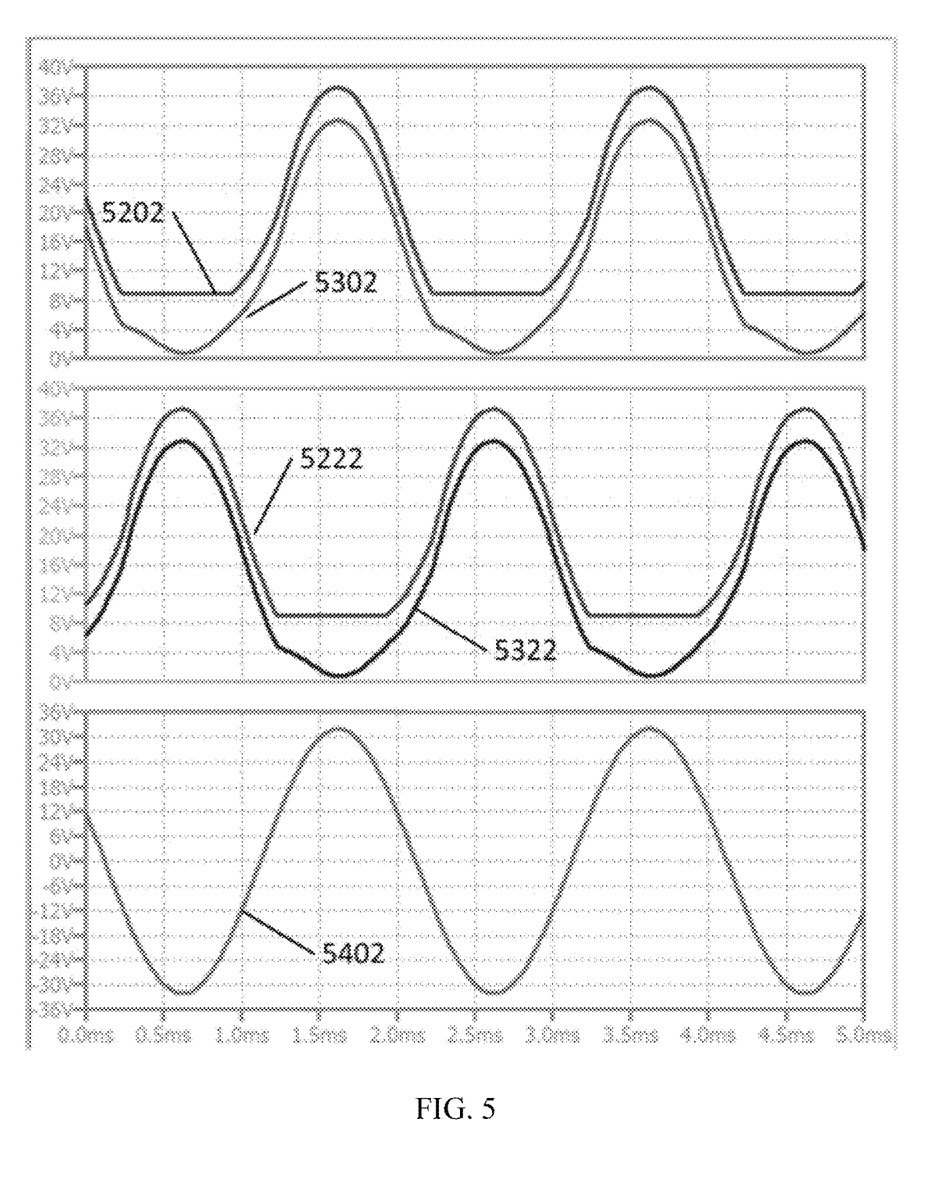
FIG. 5 shows a time-voltage curve chart of a plurality of signals in the audio system of FIG. 4.

FIG. 5 more clearly shows time-voltage curve charts of various signals output using the audio system described above with reference to FIG. 4, which shows a time-voltage amplitude curve 5202 of the first power supply voltage output by the first TPS circuit, a time-voltage amplitude curve 5302 of the amplified in-phase audio signal OUT_P output by the in-phase power amplifying circuit, a time-voltage amplitude curve 5222 of the second power supply voltage output by the second TPS circuit, a time-voltage amplitude curve 5322 of the amplified anti-phase audio signal OUT_N output by the anti-phase power amplifying circuit, and a time-voltage amplitude curve of the differential audio signal (OUT_P-OUT_N) 5402 at both ends of the speaker. As can be observed from FIG. 5, either the output of the in-phase power amplifying circuit is at the valley value or the output of the anti-phase power amplifying circuit is at the valley value, the power supply voltage has a value in a suitable range, that is, slightly higher than the valley output.

The amplified in-phase audio signal OUT_P output by the in-phase power amplifying circuit and the amplified anti-phase audio signal OUT_N output by the anti-phase power amplifying circuit have a certain degree of distortion, but the waveform of the differential audio signal output by the speaker is almost undistorted. This is because the present solution does not directly input the tracking signal to the TPS circuit, but instead, it is superimposed, as a common-mode signal, with the in-phase audio signal and the anti-phase audio signal that are to be amplified, and they are then served as control signals of the corresponding TPS circuits. Thus, in this regard, the output signal OUT_P of the in-phase power amplifying circuit and the output signal OUT_N of the anti-phase power amplifying circuit include the same common-mode signal (e.g., usually half of the power supply voltage), and therefore, the differential output (OUT_P-OUT_N) passing through the speaker can cancel out the common-mode signal to avoid distortion.

On the other hand, due to the configuration of respective TPS circuits for the in-phase power amplifying circuit and the anti-phase power amplifying circuit, it is equivalent to configuring respective power supplies for the in-phase power amplifying circuit and the anti-phase power amplifying circuit. This configuration avoids introducing large power losses in the TPS circuits and the amplifier circuits. Especially when the power amplifying circuit outputs a valley voltage, this advantage will be more apparent.

Based on the above, the audio system according to one or a plurality of embodiments of the present disclosure can improve the efficiency of the power amplifier while ensuring the audio output quality, thereby providing users with a better listening experience.

Figure 6:
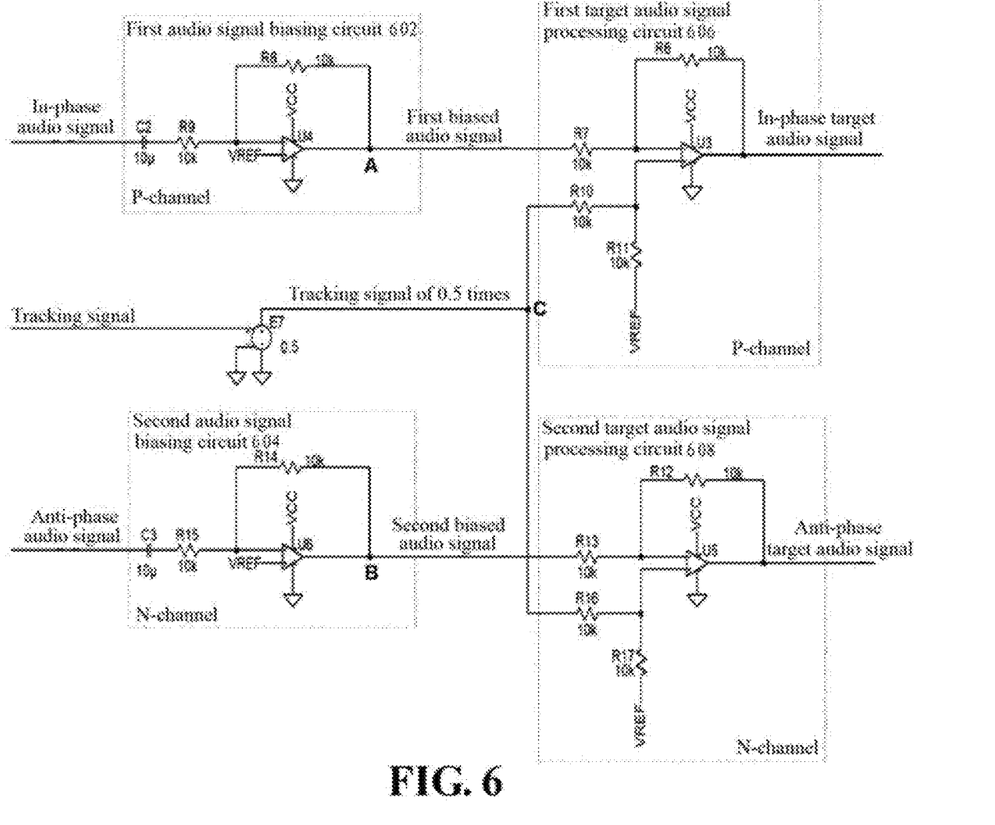
FIG. 6 illustrates an exemplary configuration diagram of a circuit implementation of a target audio signal generator module in an audio system according to one or a plurality of embodiments of the present disclosure.

FIG. 6 illustrates an exemplary configuration diagram of a circuit implementation of a target audio signal generator module in an audio system according to one or a plurality of embodiments of the present disclosure. The target audio signal generator module may include two target signal generators for two channels (a P-channel and an N-channel), respectively. For example, the first target signal generator is a signal generator corresponding to the P (in-phase) channel. The first target signal generator includes a first audio signal biasing circuit 602 and a first target audio signal processing circuit 606.

The first audio signal biasing circuit 602 biases the in-phase audio signal passing through the P-channel at a voltage VREF. An output signal (that is, a first biased audio signal) of the first audio signal biasing circuit 602 is input to the first target audio signal processing circuit 606. In addition, the first target audio signal processing circuit 606 also receives a tracking signal. The generation of the tracking signal is the same as the method mentioned above herein and will not be further repeated here. In some examples, the tracking signal first passes through a circuit (such as E7 in the figure), and a tracking signal with an amplitude value halved (that is, a tracking signal of 0.5 time) is generated. It should be understood that there are many types of circuits used for achieving that an output signal is half of an input signal. In the figure, E7 is only used for representing such an implementation circuit model, rather than limiting the specific circuit. The tracking signal of 0.5 time is supplied to the first target audio signal processing circuit 606. An output signal of the first target audio signal processing circuit 606 will be used as a control signal for controlling the first TPS circuit. For example, the output signal (that is, the in-phase target audio signal) of the first target audio signal processing circuit 606 is the tracking signal whose amplitude value is halved superimposing with the first biased audio signal.

The second audio signal biasing circuit 604 biases the anti-phase audio signal passing through the N-channel at the voltage VREF. An output signal (that is, a second biased audio signal) of the second audio signal biasing circuit 604 is input to the second target audio signal processing circuit 608. Similar to the first target audio signal processing circuit 606, the second target audio signal processing circuit 606 also receives a tracking signal of 0.5 time. An output signal of the second target audio signal processing circuit 608 will be used as a control signal for controlling the second TPS circuit. For example, the output signal (that is, the anti-phase target audio signal) of the second target audio signal processing circuit 608 is the tracking signal whose amplitude value is halved superimposing with the first biased signal.

It should be noted that in the circuit shown in FIG. 6, the first audio signal biasing circuit and the second audio signal biasing circuit are respectively configured before the first target audio signal processing circuit and the second target audio signal processing circuit, so that the audio signal is direct current (DC) biased before being fed to the first target audio signal processing circuit and the second target audio signal processing circuit. This condition intends to avoid using a DC decoupling capacitor in the first target audio signal processing circuit and the second target audio signal processing circuit. Because it is expected that the gain of the tracking signal is fixed. If the DC decoupling capacitor is used in anti-phase input paths of the operational amplifiers U3 and U5, the gain of the input "tracking signal of 0.5 time" will change with the change of a DC decoupling impedance (for example, the tracking signal frequency varies from DC to several hundred Hz), which is unfavorable. Therefore, the audio input signal is DC biased before being fed to the "target audio signal processing" module. For example, a voltage at a point A in FIG. 6 is a difference between the VREF and a voltage of the in-phase audio signal, while a voltage at a point B in FIG. 6 is a difference between the VREF and a voltage of the anti-phase audio signal. In other words, the voltage of the first audio biased signal is the difference the VREF and the voltage of the in-phase audio signal, and the voltage of the second audio biased signal is the difference between the VREF and the voltage of the anti-phase audio signal. It should be understood that the amplitude value of the VREF does not need to be specified, as long as the amplitude value of VREF can meet that the output audio signal is not clipped. In an example, for example, the VREF is 2.5 V. Because the VREF may be canceled out at the output of the "target audio signal processing" module in principle.

Figure 7:
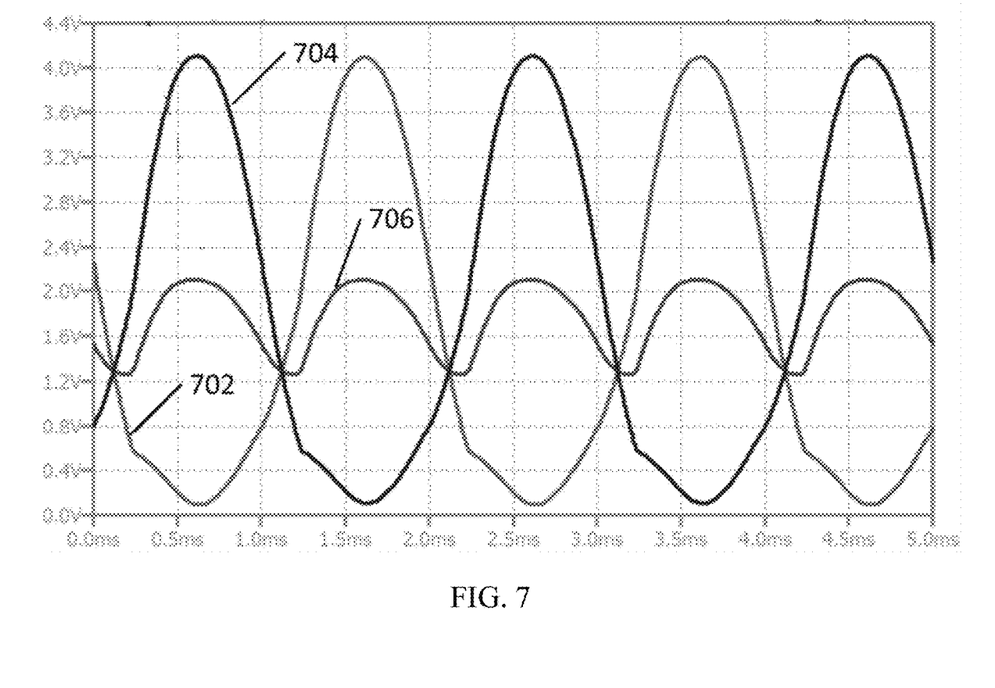
FIG. 7 shows a time-voltage amplitude curve chart of an in-phase target audio signal, an anti-phase target audio signal in FIG. 6, and a biased voltage signal measured at a point C in FIG. 6.
Figure 8:
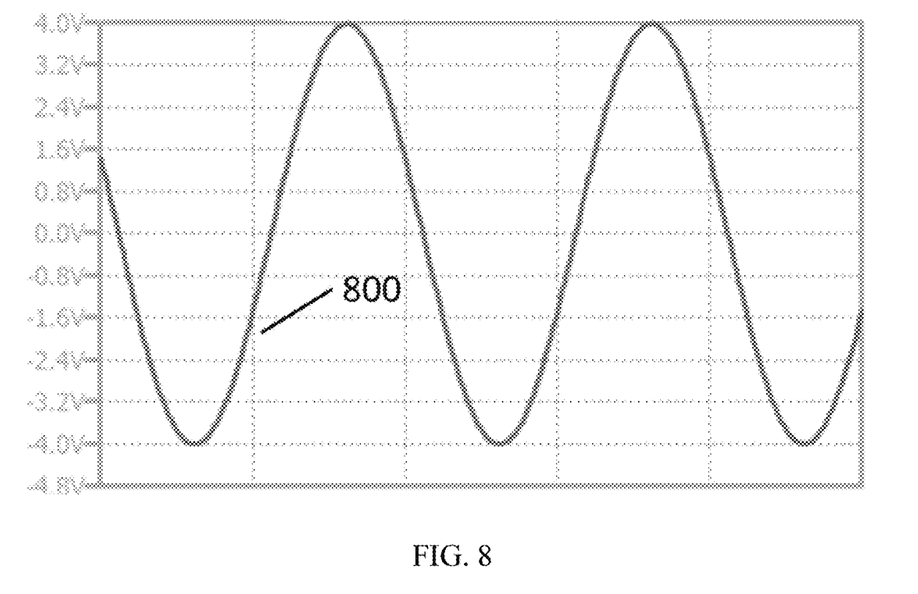
FIG. 8 shows a schematic diagram of a voltage waveform curve of a differential audio signal between an in-phase target audio signal and an anti-phase target audio signal.

FIG. 7 shows a time-voltage amplitude curve chart of an in-phase (P) target audio signal and an anti-phase (N) target audio signal in FIG. 6 and a biased voltage signal measured at a point C in FIG. 6. A curve 702 in the figure is a time-voltage amplitude curve of the in-phase target audio signal; a curve 704 in the figure is a time-voltage amplitude curve of the anti-phase target audio signal; and a curve 706 in the figure is a time-voltage amplitude curve of the biased voltage signal (that is, the tracking signal of 0.5 time measured at the point C in FIG. 6). As can be observed, both the in-phase target audio signal and the anti-phase target audio signal are severely distorted signals, this is because the tracking signal is a severely distorted audio signal generated by a nonlinear operation from the input audio signal. However, it may be understood that a differential (P—N) audio signal between the in-phase target audio signal and the anti-phase target audio signal is a good replica of the input audio signal, this is because the tracking signal that causes distortion may appear as a common-mode signal and be canceled out, as described earlier in the present disclosure, and will not be further elaborated here. FIG. 8 shows a schematic diagram of a voltage waveform curve 800 of a differential (P—N) audio signal between an in-phase target audio signal and an anti-phase target audio signal.

Figure 9:
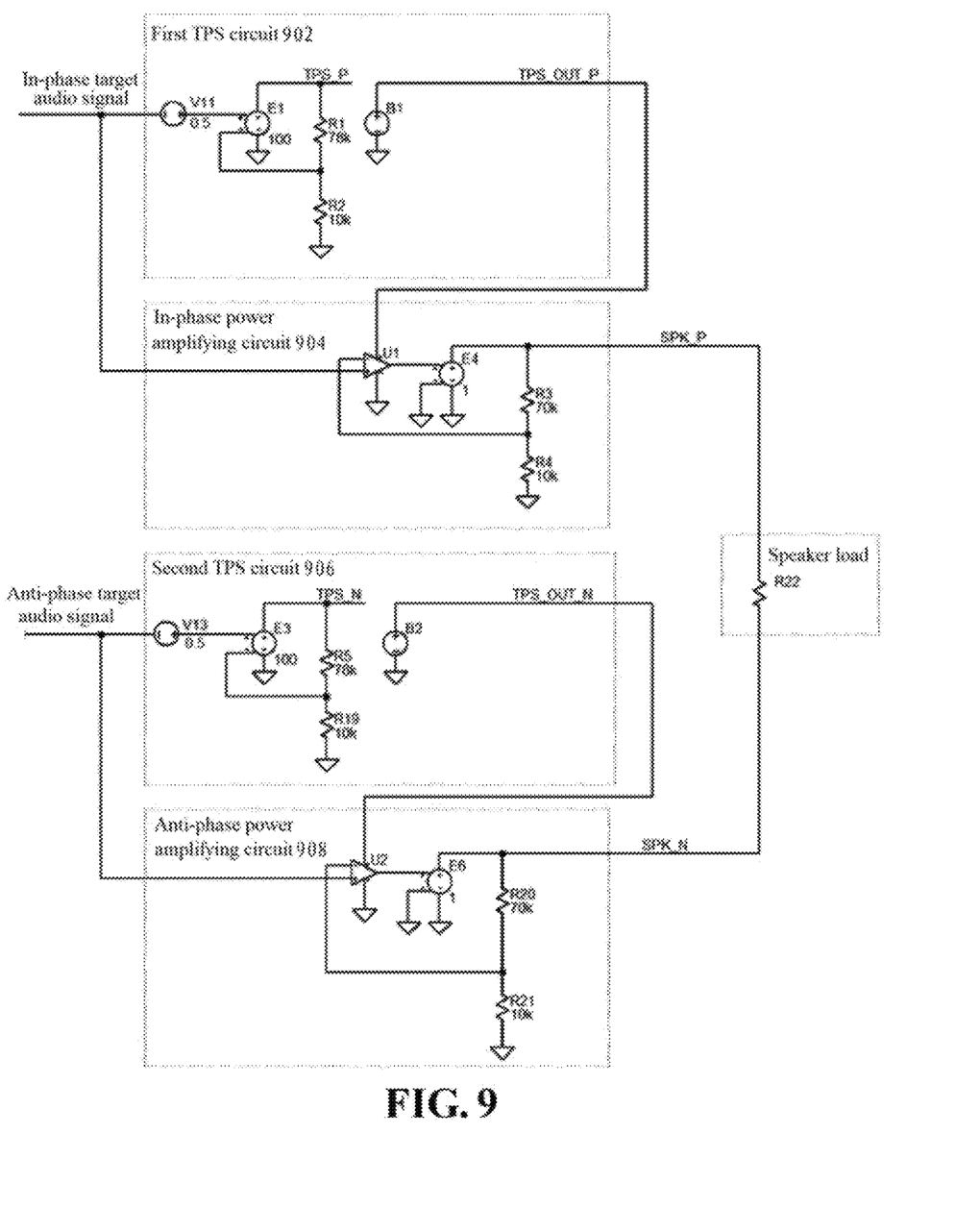
FIG. 9 shows an exemplary circuit configuration diagram of a circuit implementation of a TPS circuit module and an amplifying circuit module in an audio system according to one or a plurality of embodiments of the present disclosure.

FIG. 9 is an exemplary circuit configuration diagram of a circuit implementation of a TPS circuit module and an amplifier circuit module in an audio system according to one or a plurality of embodiments of the present disclosure. The TPS circuit module may include a first TPS circuit 902 and a second TPS circuit 906. The amplifier circuit module includes an in-phase power amplifying circuit 904 and an anti-phase power amplifying circuit 908 that are bridge connected. The first TPS circuit 902 and the second TPS circuit 906 provide power supply voltages for the in-phase power amplifying circuit 904 and the anti-phase power amplifying circuit 908, respectively.

In some examples, the first TPS circuit 902 receives an in-phase target audio signal output by the first target audio signal processing circuit and generates a first power supply voltage TPS_OUT_P based on the in-phase target audio signal, for supplying power the in-phase power amplifying circuit 904. In some examples, the first TPS circuit 902 generates the first power supply voltage TPS_OUT_P provided to the in-phase power amplifying circuit 904 based on a voltage amplitude of the in-phase target audio signal. The in-phase target audio signal output by the first target audio signal processing circuit is further input to the in-phase power amplifying circuit 904. The in-phase power amplifying circuit 904, which uses the first power supply voltage TPS_OUT_P as the power supply voltage, amplifies the received in-phase target audio signal to generate an in-phase amplified audio signal SPK_P.

For example, in the first TPS circuit 902 in the figure, a behavioral model of the circuit is shown. TPS_P is a voltage signal calculated based on the input in-phase target audio signal. A behavioral mode voltage source B1 compares a voltage of the TPS_P signal with a battery voltage. If the voltage of the TPS_P signal is higher than the battery voltage, the voltage of the TPS_P signal is used as the power supply voltage provided to the in-phase power amplifying circuit 904. If the voltage of the TPS_P signal is lower than the battery voltage, the battery voltage is used as the power supply voltage provided to the in-phase power amplifying circuit 904. Therefore, it is used for simulating the behavioral model in which the output voltage of a TPS boost circuit can only be higher than the battery voltage. The output signal TPS_OUT_P is an output result of B1, which is a voltage used for supplying power to the in-phase power amplifying circuit (such as a Class D power amplifier) 904. In other words, the first TPS circuit 902 is a boost circuit where the output voltage (TPS_OUT_P) is proportional to the voltage amplitude of the input signal (the in-phase target audio signal). When the voltage required by the in-phase power amplifying circuit 904 is higher than the battery voltage, the first TPS circuit may generate a voltage slightly higher than the output signal (SPK_P) of the in-phase power amplifying circuit 904. In addition, it should be understood that the input of a power amplifier U1 is DC coupled, that is, the in-phase target audio signal output from the in-phase target audio signal processing module 606 is directly input to the power amplifier U1 without capacitive connection to maintain the tracking signal therein.

In some examples, the second TPS circuit 906 receives the anti-phase target audio signal output by the second target audio signal processing circuit and generates a second power supply voltage TPS_OUT_N based on the anti-phase target audio signal, for supplying power to the anti-phase power amplifying circuit 908. In some examples, the second TPS circuit 906 generates the second power supply voltage TPS_OUT_N provided to the anti-phase power amplifying circuit 908 based on a voltage amplitude of the anti-phase target audio signal. The anti-phase target audio signal output by the second target audio signal processing circuit is further input to the anti-phase power amplifying circuit 908 The anti-phase power amplifying circuit 908, which uses the second power supply voltage TPS_OUT_N as the power supply voltage, amplifies the received anti-phase target audio signal to generate an anti-phase amplified audio signal SPK_N.

For example, in the second TPS circuit 906 in the figure, a behavioral model of the circuit is also shown. TPS N is a voltage signal calculated based on the input anti-phase target audio signal. A behavioral mode voltage source B2 compares a voltage of the TPS N signal with a battery voltage. If the voltage of the TPS N signal is higher than the battery voltage, the voltage of the TPS N signal is used as the power supply voltage provided to the anti-phase power amplifying circuit 908. If the voltage of the TPS N signal is lower than the battery voltage, the battery voltage is used as the power supply voltage provided to the anti-phase power amplifying circuit 908. Therefore, it is used for simulating the behavioral model in which the output voltage of a TPS boost circuit can only be higher than the battery voltage. The output signal TPS_OUT_N is an output result of B2, which is a voltage used for supplying power to the anti-phase power amplifying circuit (such as a Class D power amplifier) 908. In other words, the second TPS circuit 906 is a boost circuit where the output voltage (TPS_OUT_N) is proportional to the voltage amplitude of the input signal (the anti-phase target audio signal). When the voltage required by the anti-phase power amplifying circuit 908 is higher than the battery voltage, the second TPS circuit may generate a voltage slightly higher than the output signal (SPK_N) of the anti-phase power amplifying circuit. In addition, it should be understood that the input of a power amplifier U2 is DC coupled, that is, the anti-phase target audio signal output from the anti-phase target audio signal processing module 608 is directly input to the power amplifier U2 without capacitive connection to maintain the tracking signal therein.

Figure 10:
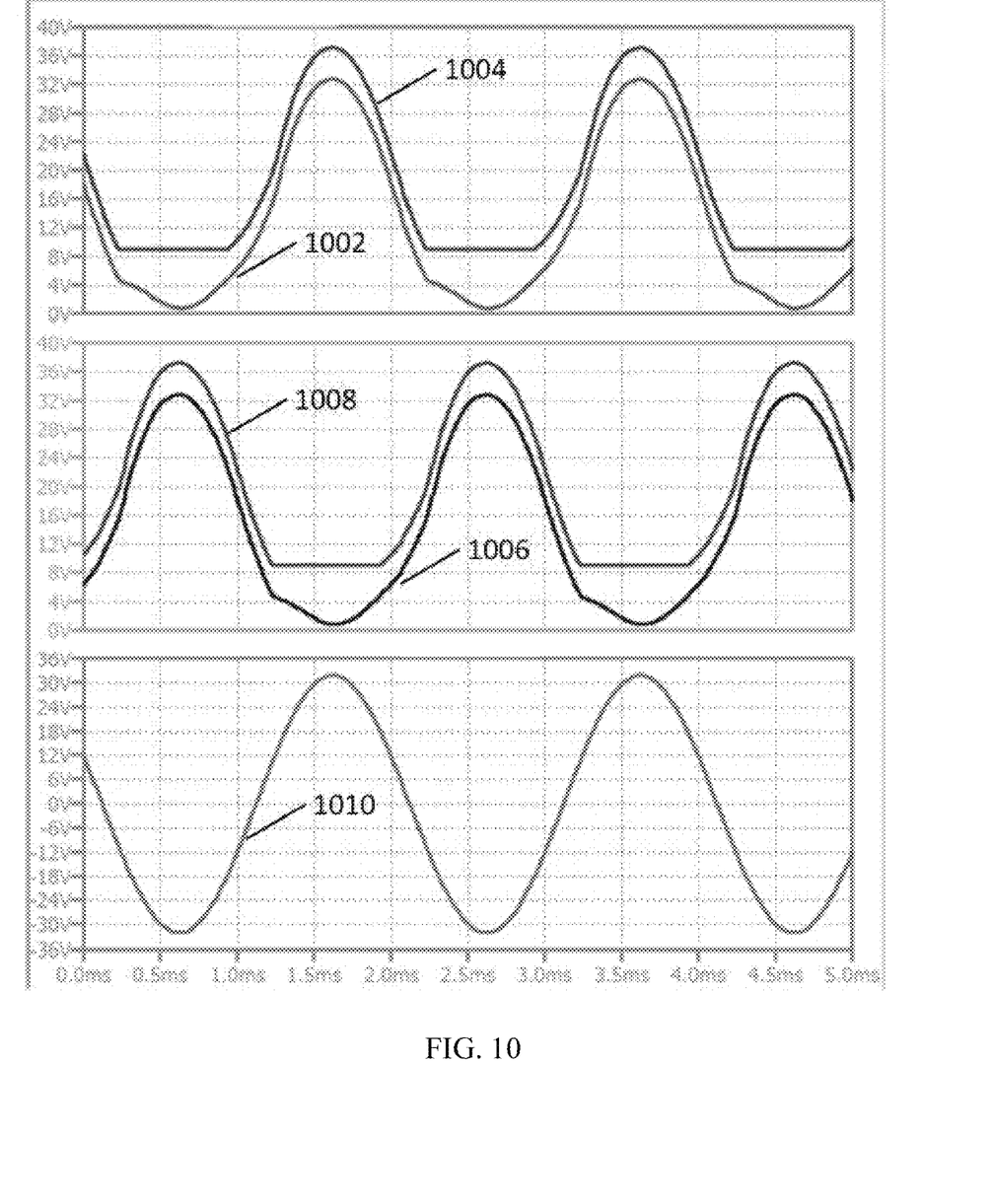
FIG. 10 shows a time-voltage amplitude curve chart of various output signals, power supply voltage signals, and a differential signal in FIG. 9.

FIG. 10 shows a time-voltage amplitude curve chart of various output signals, power supply voltage signals, and a differential signal in FIG. 9. A curve 1002 is a time-voltage amplitude curve of the amplified audio signal (SPK_P) output by the in-phase power amplifying circuit 904 (P-channel amplifying circuit); and a curve 1004 is a time-voltage amplitude curve of the power supply voltage signal (that is, the voltage signal TPS_OUT_P output by the first TPS circuit of the P-channel) provided to the in-phase power amplifying circuit 904. A curve 1006 is a time-voltage amplitude curve of the amplified audio signal (SPK_N) output by the anti-phase power amplifying circuit 908 (N-channel amplifying circuit); and a curve 1008 is a time-voltage amplitude curve of the power supply voltage signal (that is, the voltage signal TPS_OUT_N output by the second TPS circuit 906 of the N-channel) provided to the anti-phase power amplifying circuit 906. A curve 1010 is a time-voltage amplitude curve of the differential signal (SPK_P-SPK_N) viewed from both ends of the speaker.

As can be observed, the amplified audio signals SPK_P and SPK_N output by the amplifying circuits are severely distorted signals; however, the differential audio signal (SPK_P-SPK_N) at the speaker load perfectly reproduces the input audio signal. As can be seen, the technical solution proposed in the present disclosure can ensure high-quality reproduction of the audio signal.

Figure 11:
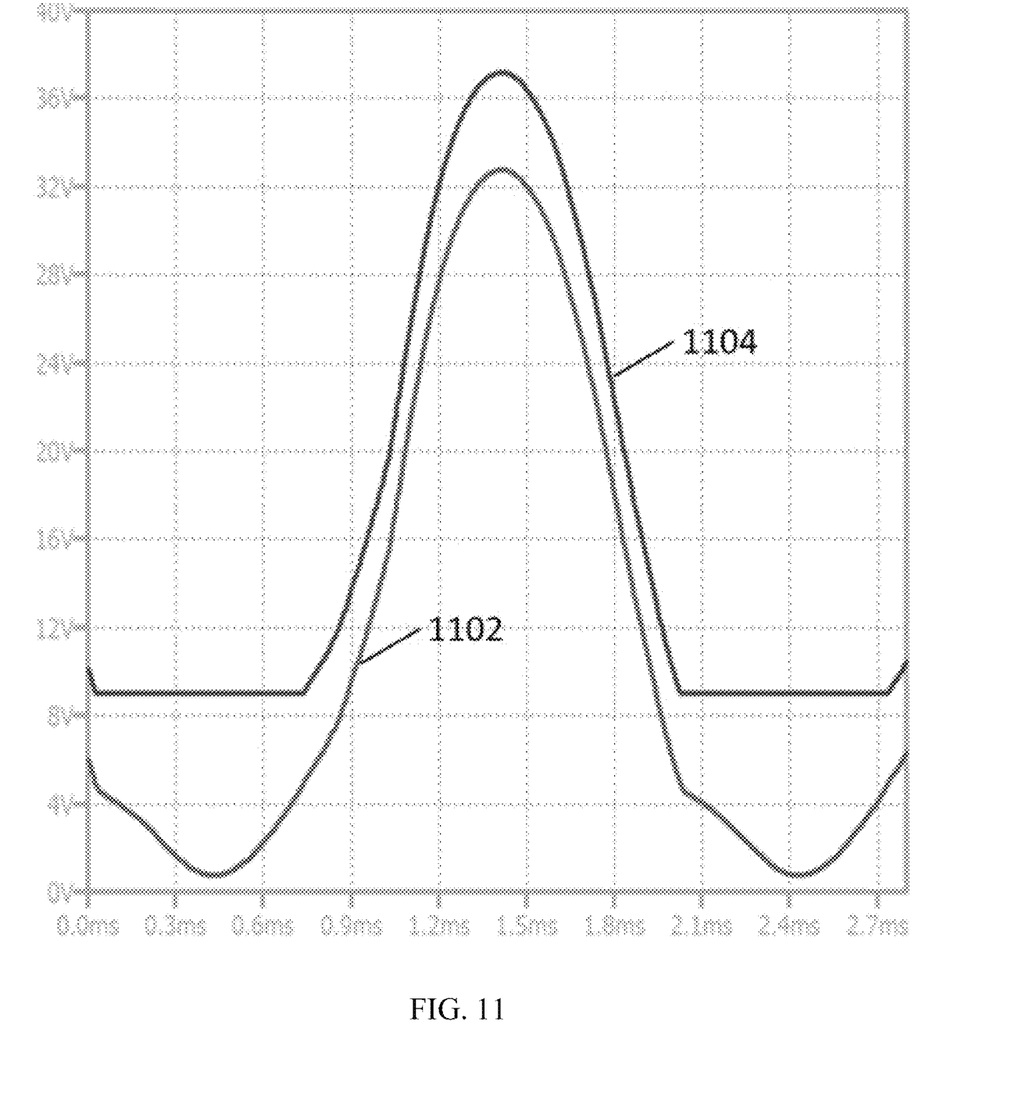
FIG. 11 shows a partial diagram of the curve waveform on the upper part of FIG. 10.

For greater clarity, FIG. 11 shows a partial diagram of the waveform on the upper part of FIG. 10. As can be observed from the figure, when the voltage amplitude of a signal 1102 output by the power amplifier is at a valley value, the power supply voltage of the power amplifier is the battery voltage (that is, the lowest voltage that can be output by the TPS circuit). Obviously, a difference between the power supply voltage and the output voltage of the power amplifier is reduced. For example, for the power amplifier, during a period when the voltage amplitude of its output signal is at a valley value, it converts the battery voltage (about 10 V) to a voltage close to 0 V, rather than converting a high voltage up to 45 V to a voltage close to 0 V. Therefore, during this period, the efficiency of the power amplifier and the TPS circuit is greatly improved.

Based at least on the above, the solution proposed in the present disclosure for improving the efficiency of the power amplifier significantly reduces, through a clever design, the power supply voltage of the power amplifier when the power amplifier outputs a valley voltage. This reduces the power consumption and heat dissipation of the TPS and amplifier circuits. As the heat dissipation decreases, the power amplifier may have a higher output power when the heat sink or metal casing of the power amplifier has the same heat dissipation capacity.

In addition, the improved solution provided in the present disclosure has more obvious advantages for a subwoofer power amplifier. In a vehicle-mounted audio system, it is often high and low sound pressure levels that limit the listening experience of users. Therefore, the improved solution provided in the present disclosure, by greatly increasing the output power of a subwoofer channel of a subwoofer audio power amplifier, can provide users with a better auditory effect and greatly improve the user experience.

Therefore, the improved solution provided in the present disclosure can not only reduce the power consumption of the audio power amplifier, reduce heat dissipation, improve the efficiency of the audio power amplifier, but also improve the auditory experience of users.

The schematic circuit diagram and schematic configuration diagram herein are only exemplary circuit implementation based diagrams provided for the better understanding and implementation of the teachings of the present disclosure by those skilled in the art and are not specific limitations to the technical solution of the present invention. It is understandable by those skilled in the art that components may be added or reduced, or parameter values of the components may be changed, according to specific application conditions of the circuit.

Clause 1. In some embodiments, an audio system includes:
  a target audio signal generator module including a plurality of target audio signal generators, configured to receive an audio signal and a tracking signal and generate a plurality of target audio signals based on the audio signal and tracking signal;
  a tracking power supply circuit module including a plurality of tracking power supply circuits, configured to receive the plurality of target audio signals and generate a plurality of power supply voltages based on the plurality of target audio signals; and
  an audio power amplifier module including a plurality of audio power amplifying circuits, configured to receive the plurality of target audio signals and the plurality of power supply voltages, and amplify the plurality of target audio signals;
  wherein each of the plurality of tracking power supply circuits provides a corresponding power supply voltage for each of the plurality of audio power amplifying circuits.

Clause 2. The audio system according to clause 1, wherein the plurality of target audio signal generators include a first target audio generator and a second target audio generator;
  wherein the first target audio generator receives an in-phase audio signal of the audio signal and the tracking signal, and generates a first target audio signal based on the in-phase audio signal and the tracking signal; and
  wherein the second target audio generator receives an anti-phase audio signal of the audio signal and the tracking signal, and generates a second target audio signal based on the anti-phase audio signal and the tracking signal.

Clause 3. The audio system according to any one of the foregoing clauses, wherein the plurality of tracking power supply circuits includes a first tracking power supply circuit and a second tracking power supply circuit; and wherein the plurality of audio power amplifying circuits include a first power amplifying circuit and a second power amplifying circuit.

Clause 4. The audio system according to any one of the foregoing clauses, wherein the first tracking power supply circuit receives the first target audio signal and generates a first power supply voltage for the first power amplifying circuit based on the first target audio signal; and
  wherein the second tracking power supply circuit receives the second target audio signal and generates a second power supply voltage for the second power amplifying circuit based on the second target audio signal.

Clause 5. The audio system according to any one of the foregoing clauses,
  wherein the first power amplifying circuit amplifies the received first target audio signal based on the first power supply voltage to generate a first amplified audio signal; and
  wherein the second power amplifying circuit amplifies the received second target audio signal based on the second power supply voltage to generate a second amplified audio signal.

Clause 6. The audio system according to any one of the foregoing clauses,
  wherein the first target audio generator includes a first audio signal biasing circuit and a first target audio signal processing circuit; and
  wherein the second target audio generator includes a second audio signal biasing circuit and a second target audio signal processing circuit.

Clause 7. The audio system according to any one of the foregoing clauses,
  wherein the first audio signal biasing circuit is configured to DC bias the in-phase audio signal using a reference voltage to generate a first biased audio signal; and
  wherein the second audio signal biasing circuit is configured to DC bias the anti-phase audio signal using the reference voltage to generate a second biased audio signal.

Clause 8. The audio system according to any one of the foregoing clauses,
  wherein the first target audio signal processing circuit receives the first biased audio signal, and superimposes the first biased audio signal and half of the tracking signal to output the first target audio signal; and
  wherein the second target audio signal processing circuit receives the second biased audio signal and superimposes the second biased audio signal and half of the tracking signal to output the second target audio signal.

Clause 9. The audio system according to any one of the foregoing clauses, wherein the first power amplifying circuit and the second power amplifying circuit are bridge connected, so that the first power amplifying circuit and the second power amplifying circuit output amplified signals with opposite phases.

Clause 10. The audio system according to any one of the foregoing clauses, wherein the audio system further includes a speaker, and the speaker generates an output signal for reproducing an audio based on the first amplified audio signal and the second amplified audio signal.

The description of the implementations has been presented for purposes of illustration and description. Suitable modifications and changes to the implementations can be performed in view of the above description, or the suitable modifications and changes can be acquired through practical means. The described methods and associated actions may also be performed in various orders other than those described in the present application, in parallel and/or simultaneously. The systems described are exemplary in nature and may include additional elements and/or omit elements. The subject matter of the present disclosure includes all novel and non-obvious combinations of the various systems and configurations disclosed and other features, functions and/or properties.

As used in the present application, an element or step recited in the singular form and preceded by the word "a/an" should be understood as not excluding the plural form of the element or step, unless such exclusion is indicated. Furthermore, references to "one embodiment" or "an example" of the present disclosure are not intended to be interpreted as excluding the existence of additional implementations that also incorporate the recited features. The present invention has been described above with reference to specific implementations. However, those of ordinary skill in the art will appreciate that various modifications and changes can be made thereto without departing from the broader spirit and scope of the present invention as set forth in the appended claims.

What is claimed is:

1. An audio system comprising:
   a target audio signal generator module comprising a plurality of target audio signal generators, configured to receive an audio signal and a tracking signal and to generate a plurality of target audio signals based on the audio signal and tracking signal;
   a tracking power supply circuit module comprising a plurality of tracking power supply circuits, configured to receive the plurality of target audio signals and to generate a plurality of power supply voltages based on the plurality of target audio signals; and
   an audio power amplifier module comprising a plurality of audio power amplifying circuits, configured to receive the plurality of target audio signals and the plurality of power supply voltages, and to amplify the plurality of target audio signals;
   wherein each of the plurality of tracking power supply circuits provides a corresponding power supply voltage for each of the plurality of audio power amplifying circuits.

2. The audio system of claim 1, wherein the plurality of target audio signal generators comprises a first target audio generator and a second target audio generator;
   wherein the first target audio generator receives an in-phase audio signal of the audio signal and the tracking signal, and generates a first target audio signal based on the in-phase audio signal and the tracking signal; and
   wherein the second target audio generator receives an anti-phase audio signal of the audio signal and the tracking signal and generates a second target audio signal based on the anti-phase audio signal and the tracking signal.

3. The audio system according of claim 2, wherein the plurality of tracking power supply circuits comprises a first tracking power supply circuit and a second tracking power supply circuit; and wherein the plurality of audio power amplifying circuits comprises a first power amplifying circuit and a second power amplifying circuit.

4. The audio system of claim 3,
   wherein the first tracking power supply circuit receives the first target audio signal and generates a first power supply voltage for the first power amplifying circuit based on the first target audio signal; and
   wherein the second tracking power supply circuit receives the second target audio signal and generates a second power supply voltage for the second power amplifying circuit based on the second target audio signal.

5. The audio system of claim 4,
   wherein the first power amplifying circuit amplifies the received first target audio signal based on the first power supply voltage to generate a first amplified audio signal; and
   wherein the second power amplifying circuit amplifies the received second target audio signal based on the second power supply voltage to generate a second amplified audio signal.

6. The audio system of claim 2,
   wherein the first target audio generator comprises a first audio signal biasing circuit and a first target audio signal processing circuit; and
   wherein the second target audio generator comprises a second audio signal biasing circuit and a second target audio signal processing circuit.

7. The audio system of claim 6,
   wherein the first audio signal biasing circuit is configured to DC bias the in-phase audio signal using a reference voltage to generate a first biased audio signal; and
   wherein the second audio signal biasing circuit is configured to DC bias the anti-phase audio signal using the reference voltage to generate a second biased audio signal.

8. The audio system of claim 7,
   wherein the first target audio signal processing circuit receives the first biased audio signal, and superimposes the first biased audio signal and half of the tracking signal to output the first target audio signal; and
   wherein the second target audio signal processing circuit receives the second biased audio signal and superimposes the second biased audio signal and half of the tracking signal to output the second target audio signal.

9. The audio system of claim 3, wherein the first power amplifying circuit and the second power amplifying circuit are bridge connected, so that the first power amplifying circuit and the second power amplifying circuit output amplify signals with opposite phases.

10. The audio system of claim 5, wherein the audio system further comprises a speaker, and the speaker generates an output signal for reproducing an audio based on the first amplified audio signal and the second amplified audio signal.

11. An audio system comprising:
    a target audio signal generator module configured to receive an audio signal and a tracking signal and to generate a plurality of target audio signals based on the audio signal and tracking signal;
    a tracking power supply circuit module configured to receive the plurality of target audio signals and to generate a plurality of power supply voltages based on the plurality of target audio signals; and
    an audio power amplifier module comprising a plurality of audio power amplifying circuits, configured to receive the plurality of target audio signals and the plurality of power supply voltages, and to amplify the plurality of target audio signals;
    wherein the tracking power supply circuit module provides a corresponding power supply voltage for each of the plurality of audio power amplifying circuits.

12. The audio system of claim 11, wherein the target audio signal generator module comprises a first target audio generator and a second target audio generator;
    wherein the first target audio generator receives an in-phase audio signal of the audio signal and the tracking signal, and generates a first target audio signal based on the in-phase audio signal and the tracking signal; and wherein the second target audio generator receives an anti-phase audio signal of the audio signal and the tracking signal and generates a second target audio signal based on the anti-phase audio signal and the tracking signal.

13. The audio system of claim 12, wherein the tracking power supply circuit module includes a first tracking power supply circuit and a second tracking power supply circuit; and wherein the plurality of audio power amplifying circuits comprises a first power amplifying circuit and a second power amplifying circuit.

14. The audio system of claim 13,
wherein the first tracking power supply circuit receives the first target audio signal and generates a first power supply voltage for the first power amplifying circuit based on the first target audio signal; and
wherein the second tracking power supply circuit receives the second target audio signal and generates a second power supply voltage for the second power amplifying circuit based on the second target audio signal.

15. The audio system of claim 14,
wherein the first power amplifying circuit amplifies the received first target audio signal based on the first power supply voltage to generate a first amplified audio signal; and
wherein the second power amplifying circuit amplifies the received second target audio signal based on the second power supply voltage to generate a second amplified audio signal.

16. The audio system of claim 12,
wherein the first target audio generator comprises a first audio signal biasing circuit and a first target audio signal processing circuit; and
wherein the second target audio generator comprises a second audio signal biasing circuit and a second target audio signal processing circuit.

17. The audio system of claim 16,
wherein the first audio signal biasing circuit is configured to DC bias the in-phase audio signal using a reference voltage to generate a first biased audio signal; and
wherein the second audio signal biasing circuit is configured to DC bias the anti-phase audio signal using the reference voltage to generate a second biased audio signal.

18. The audio system of claim 17,
wherein the first target audio signal processing circuit receives the first biased audio signal, and superimposes the first biased audio signal and half of the tracking signal to output the first target audio signal; and
wherein the second target audio signal processing circuit receives the second biased audio signal and superimposes the second biased audio signal and half of the tracking signal to output the second target audio signal.

19. The audio system of claim 13, wherein the first power amplifying circuit and the second power amplifying circuit are bridge connected, so that the first power amplifying circuit and the second power amplifying circuit output amplified signals with opposite phases.

20. An audio system comprising:
a plurality of target audio signal generators configured to receive an audio signal and a tracking signal and to generate a plurality of target audio signals based on the audio signal and tracking signal;
a plurality of tracking power supply circuits configured to generate a plurality of power supply voltages based on the plurality of target audio signals; and
a plurality of audio power amplifying circuits configured to receive the plurality of target audio signals and the plurality of power supply voltages and to amplify the plurality of target audio signals;
wherein each of the plurality of tracking power supply circuits provides a corresponding power supply voltage for each of the plurality of audio power amplifying circuits.

* * * * *